United States Patent [19]

Maruta et al.

[11] Patent Number: 5,686,525
[45] Date of Patent: *Nov. 11, 1997

[54] POLYIMIDE PRECURSOR COMPOSITION AND THE PRODUCTION OF SAID POLYIMIDE PRECURSOR COMPOSITION

[75] Inventors: Masamichi Maruta; Hidehisa Nanai, both of Kawagoe; Yoshihiro Moroi, Tokyo; Hiroshi Takahashi; Seiji Hasegawa, both of Higashimatsuyama, all of Japan

[73] Assignee: Central Glass Company, Ltd., Yamaguchi-ken, Japan

[*] Notice: The term of this patent shall not extend beyond the expiration date of Pat. No. 5,478,918.

[21] Appl. No.: 615,991

[22] Filed: Mar. 14, 1996

Related U.S. Application Data

[62] Division of Ser. No. 346,227, Nov. 22, 1994.

[30] Foreign Application Priority Data

Nov. 26, 1993 [JP] Japan .................... 5-296992

[51] Int. Cl.$^6$ .................... C08L 79/08; C08G 69/26; B41M 1/12; B05D 1/32
[52] U.S. Cl. .................... 524/600; 524/879; 528/353; 528/188; 528/229; 523/160; 427/282; 101/114; 101/129
[58] Field of Search .................... 524/600, 879; 528/353; 523/160

[56] References Cited

U.S. PATENT DOCUMENTS

| | | |
|---|---|---|
| 3,700,649 | 10/1972 | Boram et al. .................... 524/600 |
| 3,983,093 | 9/1976 | Williams, III et al. .................... 524/600 |
| 4,524,171 | 6/1985 | Bakshi et al. .................... 524/600 |
| 4,960,824 | 10/1990 | Olson et al. .................... 524/600 |
| 5,175,367 | 12/1992 | Auman et al. .................... 564/309 |
| 5,310,862 | 5/1994 | Numura et al. .................... 528/353 |
| 5,322,924 | 6/1994 | Chuang et al. .................... 528/353 |
| 5,332,799 | 7/1994 | Blum et al. .................... 528/353 |
| 5,478,918 | 12/1995 | Maruta et al. .................... 524/600 |
| 5,554,684 | 9/1996 | Choi et al. .................... 524/879 |

*Primary Examiner*—Tae Yoon
*Attorney, Agent, or Firm*—Wenderoth, Lind & Ponack

[57] ABSTRACT

A polyimide precursor composition which is produced by (i) providing a polyamide acid solution obtained by reacting an aromatic tetracarboxylic acid component and a diamine component in the presence of an oxygen-containing solvent and (ii) subjecting said polyamide acid solution to heat treatment. The polyimide precursor composition exhibits a desirable apparent viscosity and a desirable thixotropic property and it excels in film forming ability, and because of this, it enables the formation a high quality relief pattern film with no defect and which excels in form retention by way of the screen printing. Further, the polyimide precursor composition is extremely suitable for the formation of a relief pattern by way of the screen printing in production of electronic, electric, optical, or precision devices, wherein the relief pattern is required to have a reduced dielectric constant and a reduced residual stress and to have a sufficient heat resistance, moisture resistance, physical strength, and chemical stability.

8 Claims, No Drawings

5,686,525

POLYIMIDE PRECURSOR COMPOSITION AND THE PRODUCTION OF SAID POLYIMIDE PRECURSOR COMPOSITION

This application is a division of now abandoned application Ser. No. 346,227, filed Nov. 22, 1994.

BACKGROUND OF THE INVENTION

1. Field of the Invention

The present invention relates to novel polyimide precursor compositions which exhibit good thixotropic properties and apparent viscosity suitable for screen printing and excel in film-forming properties and to a process for producing said polyimide precursor compositions. The present invention further relates to novel polyimide compositions obtained from said polyimide precursor compositions and to a process for producing said polyimide compositions.

2. Related Background Art

There are known a number of polyimides which can be used as a heat resistant material. Those polyimides are often used in such a way that when applied to the surface of an object they provide a desired relief pattern. It is known that such relief pattern may be formed by applying a coating material of a given polyimide to the surface of an object by means of the spin coating technique and subjecting the resultant material to wet or dry processing thereby forming said relief pattern or by screen-printing a coating material of given polyamide to the surface of an object while forming said relief pattern. Of these methods, the latter method is the most advantageous since the processing can be accomplished in a relatively reduced number of steps.

In order to facilitate the packing efficiency of a coating material through an opening of a patterning plate while attaining the formation of a relief pattern on a substrate in a desirable state in the case where the screen-printing technique is employed, the coating material is desired to be in the form of a Bingham fluid and to have a thixotropic property. The coating material is desired to be in the form of a Newtonian fluid in the case where the spin coating technique is employed.

It is known that such characteristics desired for the coating material used in the case of employing the screen printing technique may be attained by admixing a powdery filler to a given Newtonian fluid such that said powdery filler is dispersed in said Newtonian fluid. In the case of using a varnish paste of polyamide acid or polyimide as the coating material in the case where the screen printing technique is employed, it is known that the foregoing characteristics desired for the coating material may be attained by incorporating powder of an inorganic or organic material into the varnish paste.

However, the relief pattern formed by means of the screen printing technique using a polyimide composition containing powdery filler dispersed therein is inferior to that formed by means of the spin coating technique using polyimide without using any filler, in terms of physical strength. Japanese Laid-open patent application No. 85379/1992 (hereinafter referred to as Document 1), No. 153261/1992 (hereinafter referred to as Document 2), or No. 248871/1992 (hereinafter referred to as Document 3) disclose a polyimide composition prepared by mill-mixing powdery polyimide obtained by way of chemical or physical isolation with a polyamide acid varnish, said polyimide composition being capable of accomplishing desirable dispersion of powdery filler at room temperature so that the foregoing printing characteristics required for the coating material can be attained. Said polyimide composition is capable of providing a cured product containing the powdery filler and varnish resin in a homogeneous state and has an improved physical strength.

The polyimide compositions described in Documents 1 to 3 have thixotropic properties and are suitable for screen printing. However, none of them is sufficient enough in terms of heat resistance, moisture resistance, and adhesion, and is relatively high in dielectric constant and residual stress. In addition, it is difficult to stably mass produce any of them with a high yield because the process for the production thereof includes a step of subjecting a highly viscous liquid to mechanical treatment including stirring, mixing, and kneading wherein the highly viscous liquid is not always assured to be treated in a desirable state in the mechanical treatment.

Further, as for the varnish paste of polyamide acid or polyimide used in the case where the screen printing technique is employed, it is known that the varnish paste should be made to be of a high concentration in order to improve the form retention of a pattern formed. In this case, a problem unavoidably entails in that powdery filler cannot be homogeneously dispersed in such highly viscous liquid as desired. In order to eliminate this problem, Japanese patent publication No. 1192/1990 (hereinafter referred to as Document 4) discloses a manner of providing a mixture of tetracarboxylic acid and diamine, subjecting the mixture to polymerization at a temperature of 150° C. or above to thereby obtain a suspension containing fine particles of polyimide capable of serving as powdery filler, adding tetracarboxylic acid and diamine to the suspension, and subjecting the resultant to polymerization at a relatively low temperature, thereby obtaining a polyimide precursor varnish containing fine particles of polyimide dispersed therein. However, the manner described in Document 4 is still problematic in that it is rather complicated and includes troublesome mechanical treatment of a highly viscous liquid.

SUMMARY OF THE INVENTION

An object of the present invention is to provide a polyimide precursor composition which is free of the foregoing problems found in the conventional polyimide precursor composition and which is desirably suited for the formation of a relief pattern film by way of screen printing in the production of electronic, electric, optical, and precision devices.

Another object of the present invention is to provide a polyimide precursor composition which excels in stability and which also excels in heat resistance, moisture resistance and adhesion.

A further object of the present invention is to provide a polyimide precursor composition which is desirably low in dielectric constant and residual stress.

A further object of the present invention is to provide a polyimide precursor composition which enables the effective formation of a relief pattern film having a desirable thixotropic property by way of screen printing.

A further object of the present invention is to provide a polyimide precursor composition which can be produced by reacting or mixing an aromatic tetracarboxylic acid component and a diamine in the presence of an oxygen-containing solvent, said polyimide precursor composition being excellent not only in stability but also in heat resistance, moisture resistance and adhesion, being desirably low in dielectric constant and residual stress, and being capable of effectively forming a relief pattern film having a desirable thixotropic property by way of screen printing.

A further object of the present invention is to provide a polyimide precursor composition which can be effectively produced by a simple manner of reacting or mixing an aromatic tetracarboxylic acid component, a diamine and a maleimide compound in the presence of an oxygen-containing solvent, said polyimide precursor composition being excellent not only in stability but also in heat resistance, moisture resistance and adhesion, being desirably low in dielectric constant and residual stress, and being capable of effectively forming a relief pattern film having a desirable thixotropic property by way of screen printing.

A further object of the present invention is to provide a process for producing the above polyimide precursor composition.

DESCRIPTION OF THE INVENTION AND THE PREFERRED EMBODIMENTS

The present inventors made extensive studies in order to eliminate the foregoing problems found in the conventional polyimide compositions and in order to attain the above objects.

Particularly, various polyimide compositions were prepared, and studies were made of their usability as a paste for use in screen printing through experiments. As a result, there were obtained findings that a specific polyamide acid composition can be converted into a translucent or opaque, homogenous paste-like polyimide precursor composition merely by way of heat treatment without adding any fine particles (that is, fine particles of a filler) which are usually used in order to impart a thixotropic property to a resin paste, and that in the case where said paste-like polyimide precursor composition is relatively high in terms of solid content, it exhibits a desirable thixotropic property and is desirably suitable for the formation of a relief pattern film by screen printing.

The present invention has been accomplished based on these findings. The present invention provides a polyimide precursor composition which can be produced by a simple manner of reacting a specific aromatic tetracarboxylic acid component and a specific diamine component in the presence of an oxygen-containing solvent to obtain a polyamide acid solution, and subjecting said polyamide acid solution to heat treatment. The polyimide precursor composition thus obtained enables one-o to attain a paste-like composition exhibiting an improved thixotropic property which is markedly suitable for the formation of a relief pattern film by screen printing.

In a preferred embodiment, the polyimide precursor composition is one obtained from the polyamide acid solution comprising the following three components A, B, and C.

Component A: aromatic tetracarboxylic acid component comprising 50 mole % or more of benzenetetracarboxylic acid dianhydride, biphenyltetracarboxylic acid dianhydride, terphenyltetracarboxylic acid dianhydride, benzophenonetetracarboxylic acid dianhydride, or a reactive derivative of one of these compounds.

Component B: diamine component in a mole concentration of 0.95 to 1.05 versus 1 mole of the component A, said diamine component comprising 50 mole % or more of 2,2'-bis(trifluoromethyl)diaminodiphenyl or a reactive derivative thereof, and 1 to 10 mole % of siloxydiamine.

Component C: 80 wt. % or less of oxygen-containing solvent of 180° C. to 300° C. in boiling point.

As for the solid content of the polyimide precursor composition according to the present invention, it is preferably 20 wt. % or, more or more preferably, 25 wt. % or more in order to secure the form retention of a relief pattern formed by means of screen printing using a paste comprising the polyimide precursor composition. In view of an upper limit of the viscosity for the polyimide precursor composition which can be packed through an opening of a patterning plate, it is preferably 60 wt. % or less or more preferably, 50 wt. % or less.

As for the foregoing aromatic tetracarboxylic acid component used in order to obtain the polyimide precursor composition according to the present invention, 50 mole % or more thereof is desired to comprise one or more compounds selected from the group consisting of benzenetetracarboxylic acid, biphenyltetracarboxylic acid, terphenyltetracarboxylic acid, benzophenonetetracarboxylic acid, and reactive derivatives of these compounds, specifically, their anhydrides and esters.

Specific examples of said benzenetetracarboxylic acid are pyromellitic acid, trifluoromethylbenzenetetracarboxylic acid, bistrifluoromethylbenzenetetracarboxylic acid, and difluorobenzenetetracarboxylic acid.

The remaining part of the aromatic tetracarboxylic acid component (that is, less than 50 mole % of the aromatic tetracarboxylic acid component) may comprise other appropriate organic acid or a reactive derivative thereof than those compounds above described. Specific examples are hexafluoroisopropylidenediphthalic acid, oxydiphthalic acid, and reactive derivatives of these compounds, specifically, their anhydrides and esters. These compounds may be used either singly or in combination of two or more of them.

Other than the above, it is possible for the remaining part of the aromatic tetracarboxylic acid component (that is, less than 50 mole % of the aromatic tetracarboxylic acid component) to comprise appropriate aliphatic tetracarboxylic acid or a reactive derivative thereof. Specific examples are cyclobutenetetracarboxylic acid, bicyclo(2,2,2)octo-7-ene-2,3,5,6-tetracarboxylic acid, and reactive derivatives of these compounds, specifically, their anhydrides and esters. These compounds may be used either singly or in combination of two or more of them.

In the case where these compounds as the remaining part of the aromatic tetracarboxylic acid component are used in an amount corresponding to 50 mole % or more of the aromatic tetracarboxylic acid component, there cannot be attained a polyimide precursor composition with a desirably homogeneous thixotropic property by way of the heat treatment.

The diamine component used in order to obtain the polyimide precursor composition according to the present invention is desired to comprise one or more diamines selected from the group consisting of aromatic diamines, aliphatic diamines, alicyclic diamines, and reactive derivatives of these diamines. Of these diamine compounds, those diamines which are relatively large in solubility to solvents and have an electron attractive group having a small basicity which slowly engages in reaction, and reactive derivatives of them are rather appropriate. Particularly, aromatic diamines having a substituent comprising fluorine, a polyfluoroalkyl group, or polyfluoroalcoxy group are the most appropriate.

Specifically, 50 mole % or more of the diamine component (this 50 mole % or more of the diamine component will be hereinafter referred to as "principal diamine component") comprising such diamine is desired to comprise 2,2'-bis(trifluoromethyl)diaminodiphenyl, and 1 mole % to 10 mole % thereof is desired to comprise siloxydiamine. Specific examples of the siloxydiamine are 1,3-bis(3-aminopropyl)-

1,1,2,2-tetramethyldisiloxane, 1,3-bis(3-aminobutyl)- 1,1,2,
2-tetramethyldisiloxane, bis(4-aminophenyl)dimethylsilane,
and 1,3-bis(4-aminophenoxy)tetramethyldisiloxane. These
siloxydiamines may be used either singly or in combination
of two or more of them.

The amount of such siloxydiamine is preferably in the
range of 1 to 10 mole %, or more preferably in the range of
1 to 5 mole %, versus the total amount of the diamine
component used. In the case where the siloxydiamine is in
an amount of less than 1 mole % versus the total amount of
the diamine used, there cannot be attained a desirable
adhesion. On the other hand, in the case where the siloxy-
diamine is in an amount of exceeding 10 mole % versus the
total amount of the diamine used, there cannot be attained a
desirable adhesion, and in addition, not only a reduction in
heat resistance but also an increase in residual stress is liable
to occur.

As the principal diamine component, there can be selec-
tively used other relevant diamine compounds than the
above-described 2,2'-bis(trifluoromethyl)diaminodiphenyl.
Specific examples of such diamine compound are 3,5-
diamonobenzotrifluoride, 2,5-diaminobenzotrifluoride, 3,3'-
bistrifluoromethyl-4,4'-diaminobiphenyl, 3,3'-
bistrifluoromethyl-5,5'-diaminobiphenyl, bis
(trifluoromethyl)-4,4'-diaminophenyl, bis(fluorinated alkyl)
-4,4'-diaminodiphenyl, dichloro-4,4'-diaminodipheny,
dibromo-4,4'-diaminodiphenyl, bis(fluorinated alcoxy)-4,4'-
diaminodiphenyl, diphenyl-4,4'-diaminodiphenyl, 4,4'-bis
(4-aminotetrafluorophenoxy)tetrafluorobenzene, 4,4'-bis(4-
aminotetrafluorophenoxy)octafluorobiphenyl, and 4,4,-
binaphthylamine.

The remaining less than 50 mole % of the diamine
component (the remaining less than 50 mole % of the
diamine component will be hereinafter referred to as
"supplementary diamine component") is desired to comprise
one or more of the following compounds:
o-phenylenediamine, m-pheylenediamine,
p-phenylenediamine, 2,4-diaminotoluene, 2,5-
diaminotoluene, 2,4-diaminoxylene, 2,4-diaminodurene,
dimethyl-4,4'-diaminophenyl, dialkyl-4,4'-diaminodiphenyl,
dimethoxy-4,4'-diaminodiphenyl, diethoxy-4,4'-
diaminodiphenyl, 4,4'-diaminodiphenylmethane, 4,4'-
diaminodiphenylether, 4,4'-diaminodiphenylsulfone, 3,3'-
diaminodiphenylsulfone, 4,4'-diaminobenzophenone, 3,3'-
diaminobenzophenone, 1,3-bis(3-aminophenoxy)benzene,
1,3-bis(4-aminophenoxy)benzene, 1,4-bis(4-
aminophenoxy)benzene, 4,4'-bis(4-aminophenoxy)
biphenyl, bis(4-(3-aminophenoxy)phenyl)sulfone, bis(4-(4-
aminophenoxy)phenyl)sulfone, 2,2-bis(4-(4-
aminophenoxy)phenyl)propane, 2,2-bis(4-(4-
aminophenoxy) phenyl)hexafluoropropane, 2,2-bis(4-(3
-aminophenoxy)phenyl)propane, 2,2-bis(4-(3-
aminophenoxy)phenyl)hexafluoropropane, 2,2-bis(4-(4-
amino-2-trifluoromethylphenoxy)phenyl)
hexafluoropropane, 2,2-bis (4-(3-amino-5-
trifluoromethylphenoxy)pehnyl)hexafluoropropane, 2-2-bis
(4-aminophenyl)hexafluoropropane, 2,2-bis(3-
amonophenyl)hexafluoropropane, 2,2-bis(3-amino-4-
hydroxyphenyl)hexafluoropropane, 2,2-bis(3-amino-4-
methylphenyl)hexafluoropropane, 4,4'-bis(4-
aminophenoxy)octafluorobiphenyl, and 4,4'-
diaminobenzanilide.

In the case where one or more of these compounds as the
supplementary diamine component are used in an amount
exceeding 50 mole % versus the total amount of the diamine
component used, there cannot be attained a polyimide pre-
cursor composition capable of being converted into a paste-
like state having a desirable thixotropic property suitable for
the formation of a relief pattern by the screen printing, even
when it is subjected to heat treatment.

Any of the conventional aromatic polyamide acids has
problems such that when it is treated in an oxygen-
containing solvent such as γ-butyrolactone, a complex or an
oligomer is precipitated, and because of this, a homogeneous
solution cannot be promptly obtained. In addition, since it is
poor in solubility with such solvent, gelation thereof is liable
to occur.

On the other hand, the polyamide acid produced through
the reaction of the foregoing aromatic tetracarboxylic acid
component with the foregoing diamine component in the
presence of the foregoing oxygen-containing solvent in the
present invention promptly provides a desirable, homoge-
neous polyamide acid solution without causing such a
precipitate as found in the case of the conventional aromatic
polyamide acids.

The oxygen-containing solvent used upon obtaining the
polyamide acid solution in the present invention is desired to
be of a boiling point of 180° C. to 300° C. in order to make
the resulting polyimide precursor composition such that it
can be easily handled.

In the case where the reaction of the foregoing aromatic
tetracarboxylic acid component with the foregoing diamine
component is conducted in a solvent chiefly comprising an
amide series solvent having a relatively great dissolving
power such as N-methylpyrrolidone, N,N-
dimethylformamide, or N,N-dimethylacetoamide which is
generally used in the case of producing a conventional
polyimide or its precursor, there is afforded such a polya-
mide acid solution that is reduced in terms of the viscosity
upon subjecting to heat treatment but does not realize a
relevant thixotropic property which satisfies the conditions
required for the formation of a relief pattern by the screen
printing.

Specific desirable examples of the oxygen-containing
solvent usable in the present invention are lactones such as
γ-butyrolactone, α-methyl-γ-butyrolactone, γ-valerolactone,
δ-valerolactone, γ-caprolactone, and ε-caprolactone; car-
bonates such as ethylene carbonate, and propylene carbon-
ate; esters such as butyl acetate, ethylcellosolve acetate, and
butylcellosolve acetate; ethers such as dibutyl ether, dieth-
ylene glycol dimethyl ether, and triethylene glycol dimethyl
ether; ketones such as methyl isobutyl ketone,
cyclohexanone, and acetophenone; and alcohols such as
butanol, octanol, and ethylcellosolve. These solvents may be
used either singly or in combination of two or more of them.

Other appropriate solvent may be used in a minor amount
in combination with the above oxygen-containing solvent.
Specific examples of such solvent are linear amide series
solvents, cyclic amide series solvents, urea series solvents,
sulfoxide series solvents, sulfone series solvents, hydrocar-
bon series solvents, and halogenide solvents. In any case,
any of these solvents is used in such an amount that not only
the resulting polyamide acid but also the resulting polyimide
precursor composition are not hindered in terms of stability.

The polyimide precursor composition according to the
present invention may contain an appropriate maleimide
compound. In the case of producing a polyimide precursor
composition containing a maleimide compound, the above
mentioned oxygen-containing solvents are necessary to be
selectively used.

By the way, maleimide compounds are rather unstable in
an amide series solvent containing aromatic diamine or
polyamide acid since they cause a so-called Michael reaction with the aromatic diamine or polyamide acid in the absence of a catalyst.

However, in an oxygen-containing solvent such as γ-butyrolactone, the maleimide compounds are substantially nonreactive with any of said aromatic diamine and polyamide acid in the absence of a catalyst and thus, they are desirably stable. Hence, there can be readily produced a desirable polyamide acid solution in this case. And the polyamide acid solution obtained can be maintained in a stable state and without being geled even when stored over a long period of time. Further, the polyamide acid solution enables one to obtain a desirable polyimide precursor composition which can be maintained in a stable state and without being geled over a long period of time.

As the foregoing maleimide compound usable for obtaining a polyimide precursor composition according to the present invention, there can be mentioned bismaleimides. Specific examples of such bismaleimide are fluorine-containing bismaleimides such as 2,2'-bis(4-maleimidephenyl)hexafluoropropane, 2,2'-bis(4-(4-maleimidephenoxy)phenyl)hexafluoropropane, 2,2'-bis(4-(2-trifluoromethyl-4-maleimidephenoxy)phenyl)phenyl) hexafluoropropane, phenyl)hexafluoropropane, and 4,4'-bis (4-maleimidephenoxy)octafluorobiphenyl. Other than these, other bismaleimides such as 4,4'-bismaleimidediphenylethane, 4,4'-bismaleimidediphenylether, 4,4'-bismaleimidebenzanilide, and 2,2'-bis(4-(4-maleimidephenoxy)phenyl)propane are also usable. These compounds may be used either singly or in combination of two or more of them.

The polyimide precursor composition incorporated with any of the foregoing maleimide compounds according to the present invention provides a pronounced effect in terms of adhesion when it is applied onto a non-metallic substrate of glass, ceramic, or organic material by way of screen printing. Particularly, when the polyimide precursor composition is one containing a fluorine-containing bismaleimide compound having a high solubility which is selected from those above mentioned, there is attained an improvement in film formation.

In the case of a polyimide precursor composition containing a maleimide compound with no fluorine (this compound will be hereinafter referred to as fluorine-free maleimide compound), when it is applied onto a substrate and the resultant is subjected to solvent removal, the fluorine-free maleimide compound is sometimes crystallized to make the composition applied on the substrate whitened.

However, the fluorine-containing bismaleimide compound contained in the above polyimide precursor composition has a melting point which is lower than that of the fluorine-free maleimide compound, it is greatly compatible with the polyamide acid, and it has a tendency of heightening the temperature of initiating the curing of the polyimide precursor composition. Hence, the polyimide precursor composition containing such fluorine-containing bismaleimide compound as above described is free of occurrence of such whitening phenomenon occurring in the case of the polyimide precursor composition containing the fluorine-free maleimide compound.

In the present invention, a maleimide compound may be used as a maleimide prepolymer. The maleimide prepolymer in this case is desired to comprise a bismaleimide homoprepolymer, or a bismaleimide prepolymer such as bismaleimide-diamine, bismaleimide-biscyanate, or bismaleimide-biscyanamide. In a preferred embodiment, the maleimide prepolymer comprises one or more kinds selected from the group consisting of fluorine-containing bismaleimides, fluorine-containing diamines, fluorine-containing biscyanates, and fluorine-containing biscyanamides.

As for the amount of the fluorine-containing maleimide compound or the maleimide prepolymer, it is preferably in the range of 5 to 30 wt. % or more preferably, in the range of 10 to 20 wt. %, versus the total amount of the tetracarboxylic acid component and the diamine component. In the case where the amount of the fluorine-containing maleimide compound or the maleimide prepolymer is less than said 5 wt. %, there is provided a film which is poor in adhesion. On the other hand, in the case where the amount of the fluorine-containing maleimide compound or the maleimide prepolymer exceeds said 30 wt. %, there is provided a film which is poor not only in adhesion but also in mechanical properties.

The polyimide precursor composition according to the present invention may contain, in addition to the foregoing maleimide compound, one or more unsaturated compounds such as vinyl compounds, allyl compounds and the like.

In the following, description will be made of a process of producing a polyimide precursor composition according to the present invention.

As previously described, the polyimide precursor composition according to the present invention may be effectively produced by reacting a specific aromatic tetracarboxylic acid component with a specific diamine component in the presence of a specific oxygen-containing solvent to obtain a polyamide acid solution, and subjecting said polyamide acid solution to heat treatment.

The above heat treatment may be conducted by way of the so-called cooking technique which is employed in the adjustment of the molecular weight, i.e., viscosity of the conventional polyamide acid solution. Particularly, the heat treatment may be accomplished by merely subjecting the polyamide acid solution to heat treatment at a temperature of 60° C. to 100° C. for a predetermined period of time without conducting any mechanical operation such as stirring. By this, there is afforded a translucent or opaque polyimide precursor composition containing the oxygen-containing solvent. In the case where the polyamide acid solution is one with a solid content of 25 wt. % or more, there is afforded a homogeneous paste-like polyimide precursor composition having a desirable thixotropic property.

In the conventional process of producing the conventional polyamide acid solution with a high concentration and a high viscosity, it is required to use a reaction vessel equiped with a specific loading device for serially introducing additives and a specific stirring device. In addition, it is difficult to effectively take out the resultant viscous polyamide acid solution from the reaction vessel. Further in order to obtain a desirable product having a thixotropic property, it is required to uniformly disperse a powdery organic or inorganic material into the viscous polyamide acid solution, but this is very difficult to be conducted as desired. And in the case of producing a variety of products, it is required to clean the reaction vessel every time not only after having obtained each product but also after having separately dried each product.

The process of the present invention is free of such problems found in the conventional process.

The conditions of temperature and time period under which the above heat treatment of the process according to the present invention is conducted are somewhat different depending upon the chemical composition, solid content, and volume of the polyamide acid solution used and also depending upon a viscoelastic property desired for a paste-like polyimide precursor composition to be obtained, and the conditions should be therefore properly determined while having a due care about the above-described factors. However, in general, the heat treatment is conducted at a temperature preferably in the range of from 60° C. to 100° C. or more preferably, in the range of from 70° C. to 90° C. for a period of time of 3 hours to 24 hours.

In the case where the heat treatment is conducted at a temperature of lower than 60° C., the conversion of the polyamide acid into a polyimide precursor does not proceed at a desirable conversion speed. On the other hand, in the case where the heat treatment is conducted at a temperature of higher than 100° C., the conversion of the polyamide acid into a polyimide precursor proceeds at an excessively high conversion speed. In any of these cases, it is difficult to effectively obtain a polyimide precursor composition having a controlled viscoelastic property of exhibiting a desirable screen printing property. Further, in the case where the temperature and the time period of the heat treatment are insufficient, there is provided such a paste-like polyimide precursor composition that is poor in release from a patterning plate and is also poor in form retention of a relief pattern formed. In the case where the temperature and the time period of the heat treatment are excessive, there is provided such a paste-like polyimide precursor composition that provides a relief pattern which is poor not only in mechanical strength but also in resistance to shrinkage stress and is therefore liable to suffer from occurrence of cracks.

The reason why the foregoing translucent or opaque polyimide precursor composition is afforded when the polyamide acid solution is subjected to the above heat treatment is not clear enough at the present time. But it is considered due to occurrence of a micro and uneven structural state in the polyimide precursor composition as a result of the heat treatment.

As for the polyamide acid solution used for producing the polyimide precursor composition of the present invention, it may be properly obtained by reacting the foregoing aromatic tetracarboxylic acid component with the foregoing diamine component in the presence of the foregoing oxygen-containing solvent, as above described. In the present invention, the polyamide acid solution is desired to be in a homogeneous state. Such homogeneous polyamide acid solution may be obtained by (a) a manner of providing a solution comprising the diamine component dissolved in the oxygen-containing solvent and adding the aromatic tetracarboxylic acid component to said solution or (b) a manner of providing a solution comprising the aromatic tertracarboxylic acid component dissolved in the oxygen-containing solvent and adding the diamine component to said solution. Of these two manners (a) and (b), the manner (a) is the most appropriate. Particularly, in the case where aromatic tetracarboxylic acid anhydride is used as the aromatic tetracarboxylic acid component, the manner (a) is the most appropriate because said aromatic tetracarboxylic acid anhydride is low in solubility.

In the case where the diamine component is mixed with the aromatic tetracarboxylic acid component and the oxygen-containing solvent is added, there cannot be obtained a homogeneous polyamide acid solution because polymerization reaction occurs rapidly between the two components before they are homogeneously dissolved in the oxygen-containing solvent, thereby causing an increase in viscosity or formation of a complex of the two components wherein solid blocks are formed. However, any of the above described two manners (a) and (b) is free of these problems.

As above described, the polyamide acid solution in the present invention may be one obtained by using the foregoing maleimide compound in addition to the aromatic tetracarboxylic acid component and the diamine component wherein they are reacted with each other in the presence of the oxygen-containing solvent. In this case, any of the above described manners (a) and (b) may be employed. However, in the case where siloxydiamine having a strong nucleophilic property is used as the diamine component, it is preferred to employ the manner (b) wherein the maleimide compound is dissolved together with the aromatic tetracarboxylic acid component in the presence of the oxygen-containing solvent, for the following reason. That is, the so-called Michael reaction is liable to readily occur between the siloxydiamine as the diamine component and the maleimide compound to cause precipitation of an insoluble solid or gelation and it is therefore necessary to prevent occurrence of such Michael reaction. In any case, as long as the maleimide compound is subjected to admixture with other components soon after the addition thereof, there is no particular restriction for the sequence of adding the maleimide compound. Particularly, the addition of the maleimide compound may be conducted by a modification of any of the above described manners (a) and (b), specifically, (i) a manner of admixing the maleimide compound with oligomerized amide acid as the tertracarboxylic acid component, (ii) a manner of providing a solution of the diamine component dissolved in the oxygen-containing solvent, dissolving aromatic tetracarboxylic acid anhydride as the aromatic tetracarboxylic acid component in said solution, and then dissolving the maleimide compound in the resultant, or (iii) a manner of dissolving the maleimide compound together with the diamine component in the oxygen-containing solvent.

The present inventors made experimental studies of the conventional polyamide acid solution with a solid content of 20 wt. % or more obtained by the conventional polyamide acid solution preparation manner, which is used for obtaining a polyimide precursor composition usable in screen printing. As a result, there were obtained the following findings. That is, the polyamide acid solution with a high solid content has a remarkable viscosity and because of this, it is difficult for the polyamide acid solution to attain uniform stirring and mixing with other components, and this situation leads to causing the formation of a non-homogeneous polyimide precursor composition accompanied by a phase separation upon subjecting the polyamide acid solution to heat treatment. And if a homogeneous polyimide precursor composition should have been fortunately obtained using said polyamide acid solution, the resultant polyimide precursor composition is problematic in that air bubbles are readily taken into the texture thereof when subjected to stirring.

In order to solve such problems found in the conventional polyamide acid solution obtained by the conventional polyamide acid solution preparation manner, the present inventors made studies by providing a plurality of aromatic tetracarboxylic acid component solutions and a plurality of diamine component solutions, obtaining a plurality of mixtures by mixing a predetermined amount of one of the aromatic tetracarboxylic acid component solutions with one of the diamine component solutions in an amount substantially equivalent to that of the aromatic tetracarboxylic acid component solution, and observing the behavior of each of the resultant mixtures. As a result, there was obtained the following finding. That is, in the case of using a high concentration aromatic tetracarboxylic acid component solution, specifically, a high concentration solution of an oligomer comprising an aromatic tetracarboxylic acid or its derivative and a diamine, and an diamine component solution, there is provided a mixture in which the two solutions are not mixed with each other because of a difference in viscosity between the two solutions and which is accompanied by a phase separation in which the two solutions are apparently separated one from the other. As a result of having subjected this mixture with a phase separation to stirring in the conventional stirring device with a paddle agitator, air bubbles were markedly taken into the mixture. Separately, the mixture with a phase separation was rapidly stirred by means of a revolution and rotation type centrifugal system. As a result, there could be readily obtained a highly viscous and homogeneous solution with no accompaniment of any air bubble.

Not only the solution of the tetracarboxylic acid component comprising a compound selected from the group consisting of the foregoing tetracarboxylic acids, derivatives of said tetracarboxylic acids, oligomers of said tetracarboxylic acids with appropriate diamines and derivatives of said oligomers but also the solution of any of the foregoing diamine components used in the present invention have a viscosity which is remarkably lower than that of a polyamide acid solution obtained by mixing these two solutions. Because of this, there can be effectively obtained a desirable polyamide acid solution with an extremely slight content of particles, which are liable to cause problems upon film formation, by subjecting each of the two solutions to filtration treatment and then mixing the two filtrated solutions.

In the present invention, reaction products obtained from the foregoing tetracarboxylic acid anhydrides and water, appropriate alcohol or the foregoing diamines in an amount of 0.5 molar equivalent or less may be also used as the tetracarboxylic acid component. Particularly, the reaction products obtained from the foregoing tetracarboxylic acid anhydrides and water or appropriate alcohol are effective in obtaining a solution containing the polyamide acid component with a high concentration while adjusting its polymerization degree and viscosity. Further, reaction products obtained from oligomerized amide acids as tetracarboxylic acid anhydrides (each obtained from the foregoing tetracarboxylic acid and the corresponding diamine in an amount of 0.5 molar equivalent or less) and water or appropriate alcohol are effective in obtaining a solution containing the tetracarboxylic acid component with a high concentration and having a reduced viscosity. However, those reaction products obtained from oligomerized amide acids as tetracarboxylic acid anhydrides (each obtained from the foregoing tetracarboxylic acid and the corresponding diamine in an amount exceeding 0.5 molar equivalent) and water or appropriate alcohol are not desirably used, because any of the solutions containing the tetracarboxylic acid component at a high concentration, which are obtained using such reaction products, is of an increased viscosity, wherein it cannot be readily handled, and it is difficult to be smoothly transported while properly adjusting its amount.

Specific examples of the alcohol usable in the above are methanol, ethanol, propanol, methyl cellosolve, ethyl cellosolve, and diethylene glycol monomethyl ether.

In the present invention, as for the polyamide acid solution, in order to attain a desired polymerization degree and a desired viscosity while maintaining it at a desired concentration, it is effective to incorporate a desired amount of water or any of the above mentioned alcohols into the oxygen-containing solvent upon the production thereof.

As for the polyamide acid solution obtained by using the foregoing oligomerized tetracarboxylic acid component, the polymerization degree thereof may be properly adjusted as desired by a manner of subjecting the oligomerized tetracarboxylic acid component to cooking treatment at a temperature of 50° to 100° C. for an about one hour in the process for the production thereof.

Any of the polyimide precursor compositions provided according to the present invention exhibits a pronounced thixotropic property. That is, it shows a remarkable difference between an apparent viscosity at a steady rate of shear of 20 $sec^{-1}$ and an apparent viscosity at a steady rate of shear of 0.5 $sec^{-1}$ in the measurement using a viscosity measuring instrument RHEOLAB MC20 (trademark name, produced by Physica Company) (the viscosity measurement is conducted at 22° C. by way of the corn/plate or cylinder method).

The thixotropic property of a material may be determined based on a thixotropic factor obtained by the equation: $\eta_{0.5}/\eta_{20}$, with $\eta_{0.5}$ being an apparent viscosity at a steady rate of shear of 0.5 $sec^{-1}$ and $\eta_{20}$ being an apparent viscosity at a steady rate of shear of 20 $sec^{-1}$. And when said thixotropic factor obtained by the above equation is 3 or more, the material exhibits a thixotropic property suitable for the screen printing.

The polyimide precursor composition having such a pronounced thixotropic property according to the present invention provides a high quality relief pattern of 0.1 to 100 μm in thickness after baking.

The present invention makes it possible to produce a polyimide precursor composition capable of providing a desired viscoelasticity depending upon the form and thickness of a patterning plate used, by selectively using an appropriate monomer in the preparation of the polyamide acid solution, properly adjusting the conditions for preparing the tetracarboxylic acid component solution, properly adjusting the solid content in the polyamide acid solution, or/and properly adjusting the conditions in the heat treatment of the polyamide acid solution.

Any of the polyimide precursor compositions according to the present invention provides a paste having a viscoelasticity which is 300 dyn.s/cm² to 25000 dyn.s/cm² in apparent density ($\eta_{0.5}$) at 0.5 $sec^{-1}$ and 100 dyn.s/cm² to 5000 dyn.s/cm² in apparent density ($\eta_{20}$) at 20 $sec^{-1}$. In the case where the apparent density ($\eta_{0.5}$) is less than 300 dyn.s/cm² and the apparent density ($\eta_{20}$) is less than 100 dyn.s/cm², there cannot be attained a desirable paste which provides a relief pattern excelling in form retention. In the case where the apparent density ($\eta_{0.5}$) exceeds 25000 dyn.s/cm² and the apparent density ($\eta_{20}$) exceeds 5000 dyn.s/cm² there cannot be attained a desirable paste excelling in packing efficiency.

Particularly, any of the polyimide precursor compositions according to the present invention provides a desirable paste having such viscoelasticity as above described, and because of this, there can be attained an improved packing efficiency through an opening of a patterning plate while attaining a desired thickness for a relief pattern formed in screen printing, whereby a relief pattern having an improved form retention is effectively formed.

The polyimide precursor composition according to the present invention enables one to form an improved coating film (or body) having a desired pattern and with a desired thickness on a given substrate in a state wherein a very small stress of less than 20 MPa is caused, by means of screen printing. The pattern comprised of the coating film thus formed is subjected to solvent removal and to thermal curing, whereby the pattern is converted into a polyimide relief pattern. The resultant polyimide relief pattern excels in both drape and adhesion with a substrate, and further in physical characteristics.

The conditions for the above solvent removal of the coating film are somewhat different depending upon the thickness of the coating body. However, in general, the solvent removal is conducted by subjecting the coating film to heat treatment at a temperature of 50° to 200° C. for 10 to 150 minutes in an inert gaseous atmosphere composed of dried air, $N_2$ gas or $H_2$ gas. Particularly, in the case where the coating film is of a thickness of 10 μm or less, the solvent removal can be attained by subjecting the coating film to heat treatment at a temperature of 100° C. or more for a period of time of less than 30 minutes in an inert gaseous atmosphere composed of dried air, $N_2$ gas or $H_2$ gas. In the case where the coating film is of a thickness of more than 50 μm, a problem is liable to occur in that the coating film is whitened or suffers from occurrence of air bubbles upon the solvent removal. In order to prevent occurrence of such problem, the solvent removal of said coating film is desired to be conducted at a relatively low temperature of less than 80° C. for a relatively long period of time, i.e., 30 minutes or more while maintaining the coating film in an inert gaseous atmosphere composed of dried air, $N_2$ gas or $H_2$ gas.

The polyimide precursor composition according to the present invention enables one to form, on any substrate having a coefficient of thermal expansion of 30 ppm/°C. or less, a desirable coating film with a desired pattern, which provides an improved relief pattern after solvent removal and thermal curing, by means of screen printing. Specific examples of such substrate are members made of copper (Cu), aluminum (Al), or silicon (Si); members made of metal alloys such as stainless steel; ceramic members made of alumina, glass, borosilicate glass, quartz, zirconia, or mullite; and semiconductor material members made of barium titanate, lithium niobate, tantalum niobate, gallium arsenic, or indium phosphide. These members may be ones having a coat formed of a heat resistant polymer such as aromatic polyamide, polyphenylene, polyxylene, polyphenylene oxide, polysulfone, polyamide-imide, polyester imide, polybenzimidazole, polyquinazolinedion, or polybenzooxadion.

Particularly, the polyimide precursor composition according to the present invention can be desirably used in the formation of an interlayer insulating film or a surface protective film in various electronic devices. Specifically, the polyimide precursor composition according to the present invention can be desirably used in the formation of an interlayer insulating film or a surface protective film in wiring boards comprised of silicon or gallium arsenic for monolithic ICs such as DRAM, SRAM, or CPU, or in wiring boards comprised of ceramics or glass for other semiconductor devices such as hybrid IC, thermal head, image sensor, or multichip circuit, or in flexible printed wirings, or in rigid connection boards. In addition, the polyimide precursor composition according to the present invention can be desirably used also in the formation of a multipurpose protective film, specifically for instance, an alpha-ray shielding film.

In the following, experiments which were conducted by the present inventors in order to accomplish the present invention will be described.

EXPERIMENT 1

1. Preparation of polyamide acid composition solution

There was firstly provided a four neck flask provided with a temperature gage, a stirring instrument, a reflux condenser, and a nitrogen gas feed pipe. Into the four neck flask, there were introduced 6.89 g of ABL (2,2-bis(trifluoromethyl)-4, 4'-diaminodiphenyl; 21.52 mmol, 97 mol %), 0.165 g of TMDS (1,3-bis(3-aminopropyl)tetramethyldisiloxane; 0.66 mmol, 3 mol %), 4.84 g of PMDA (pyromellitic dianhydride; 22.19 mmol), and 1.78 g of OFM (2,2'-bis(4-(4-maleimide-2-trifluoromethylphenoxy)phenyl) hexafluoropropane; said 1.78 g corresponding to an amount of 15 wt. % versus the total solid content of a polyamide acid which will result). Thereafter, 77.5 g of γ-butyrolactone as a solvent was introduced into the four neck flask. The contents in the four neck flask were stirred at room temperature for 24 hours while introducing nitrogen gas into the four neck flask through the nitrogen gas feed pipe. Thus, there was obtained a viscous solution of a polyamide acid composition. A test sample of the resultant solution was subjected to measurement of an apparent viscosity using the viscosity measuring instrument RHEOLAB MC20 (trademark name, produced by Physica Company), wherein the viscosity measurement was conducted with a frequency of 1Hz and at 22° C. by way of the corn/plate method. As a result, the solution was found to be 490 dyn.s/cm² in apparent density. In addition, the solution was found to be 15 wt. % in solid content.

Further, as for the above polyamide acid composition solution, there were measured (a) an apparent viscosity at a steady rate of shear of 0.5 sec$^{-1}$ and (b) an apparent viscosity at a steady rate of shear of 20 sec$^{-1}$. As a result, the apparent viscosities (a) and (b) were found to be 500 dyn.s/cm² and 430 dyn.s/cm² respectively. Based on the two apparent viscosities (a) and (b), the polyamide composition solution was found to be of a thixotropic factor of 1.2.

2. Formation of films and evaluation of the films (1). There were provided five different substrates, i.e., an aluminum substrate, a silicon wafer substrate, an alumina substrate, a borosilicate glass substrate, and a silicon wafer substrate applied with a polyimide film to its surface. As for each of these five substrates, the polyamide composition solution obtained in the above 1 was applied on its surface in an amount to provide a thickness of about 2 μm when baked by way of the spin coating manner. The resultant was baked at 350° C. for an hour. In this way, there were obtained five substrate samples each having an about 2 μm thick polyimide composition film formed thereon.

At the polyimide composition film of each substrate sample, 100 squares of 1 mm×1 mm in size were formed in accordance with JIS K-5400, wherein the pressure cooker test was conducted for 100 hours under conditions of 121° C. for the environmental temperature and 2.2 kg/cm² for the pressure applied. As for each substrate sample having been subjected to the pressure cooker test, the tape peel test was conducted in order to evaluate the adhesion of the polyimide composition film on the substrate sample. As a result, no peeling occurred at the polyimide composition film on each substrate sample. Thus, it was found that the polyimide composition film formed on the surface of each of the five substrates is satisfactory in adhesion with the substrate.

(2). There were provided three silicon wafer substrates of 4 in. in diameter. As for each of these three silicon wafer substrates, the polyamide composition solution obtained in the above 1 was applied on its surface in an amount to provide a thickness of about 30 um when baked, by way of the spin coating manner. One of the three resultants was baked at 250° C. for an hour (this will be hereinafter referred to as substrate sample A). One of the two remaining resultants was baked at 300° C. for an hour (this will be hereinafter referred to as substrate sample B). The last one was baked at 350° C. for an hour (this will be hereinafter referred to as substrate sample C). In this way, there were obtained three substrate samples A, B, and C each having an about 30 µm thick polyimide composition film formed thereon. As for each of the three substrate samples A, B and C, the magnitude of substrate strain and the magnitude of residual stress were measured by means of a thin film stress measuring instrument Model F-2300 (produced by Flexus Company). The three substrate samples A, B and C were found to be −2 µm, 9 µm and 3 µm respectively, with respect to the magnitude of substrate strain. And the three substrate samples A, B and C were found to be small, i.e., 1 MPa, −5 MPa, and −2 MPa respectively, with respect to the magnitude of residual stress. Thereafter, each of the substrate samples A and B was again baked at 350° C. for an hour. As for each of the two substrate samples A and B thus treated, the magnitude of substrate strain and the magnitude of residual stress were measured in the same manner as in the above. As a result, the two substrate samples A and B were found to be 1 µm and 5 µm respectively, with respective to the magnitude of substrate strain and to be −0.2 MPa and −2 MPa respectively, with respect to the magnitude of residual stress.

(3). There were provided a plurality of silicon wafer substrates of 4 in. in diameter. As for each silicon wafer substrate, the polyamide acid composition solution obtained in the above 1 was applied on its surface in an amount to provide a thickness of about 30 µm when baked, by way of the spin coating manner. Each of the resultants was subjected to first baking treatment at 300° C. for an hour, and immediately after this, it was subjected to second baking treatment at 350° C for an hour. Thus, there were obtained a plurality of substrate samples. As for each of the substrate samples obtained, the magnitude of substrate strain and the magnitude of residual stress were measured in the same manner as in the above (2). As a result, each of the substrate samples was found to be 2 µm with respect to the magnitude of substrate strain and to be −1 MPa with respect to the magnitude of residual stress.

(4). The procedures in the above (3) were repeated, except that the temperature condition in the second baking treatment was varied, to thereby obtain a plurality of substrate samples. As for each of the resultant substrate samples, the magnitude of residual stress was measured in the same manner as in the above (2). Based on the results obtained, the interrelation between the baking temperature and the magnitude of residual stress was observed. As a result, there was obtained a finding that when the temperature condition in the final baking treatment is made to be a temperature near the maximum exothermic temperature of OFM (that is, 305° C.), there is provided a maximum value (an absolute value) in terms of the magnitude of residual stress.

EXPERIMENT 2

1. Preparation of polyamide acid composition solution

The procedures in the preparation of polyamide acid composition solution 1 in Experiment 1 were repeated, except that no OFM was used, to thereby obtain a polyamide acid composition solution.

2. Formation of films and evaluation of the films

There were provided five different substrates, i.e., an aluminum substrate, a silicon wafer substrate, an alumina substrate, a borosilicate glass substrate, and a silicon wafer substrate applied with a polyimide composition film to its surface. As for each of these five substrates, the polyamide acid composition solution obtained in the above 1 was applied on its surface in an amount to provide a thickness of about 2 um when baked, by way of the spin coating manner. The resultant was baked at 350° C. for an hour. In this way, there were obtained five substrate samples each having an about 2 um thick polyimide composition film formed thereon.

At the polyimide composition film of each substrate sample, 100 squares of 1 mm×1 mm in size were formed in accordance with JIS K-5400, wherein the pressure cooker test was conducted for 100 hours under conditions of 121° C. for the environmental temperature and 2.2 kg/cm² for the pressure applied. As for each substrate sample having subjected to the pressure cooker test, the tape peel test was conducted in order to evaluate the adhesion of the polyimide composition film on the substrate sample. As a result, peeling occurred at the polyimide composition film on each substrate sample. Thus, it was found that the polyimide composition film formed on the surface of each of the five substrates was apparently inferior in adhesion with the substrate.

The present invention will be described in more detail with reference to examples which will be described below. It should be understood that these examples are only for illustrative purposes and are not intended to restrict the scope of the present invention.

EXAMPLE 1

1. Preparation of polyamide acid solution (i). Preparation of tetracarboxylic acid component solution:

Into a four neck flask provided with a temperature gage, a stirring instrument, a reflux condenser, and a nitrogen gas feed pipe, there were introduced 225.49 g of ABL (2,2-bis (trifluoromethyl)-4,4'-diaminodiphenyl; 0.704 mol), 399.32 g of PMDA (pyromellitic dianhydride; 1.8307 mol), and 147.4741 g of OFM (2,2'-bis(4-(4-maleimide-2-trifluoromethylphenoxy)phenyl)hexafluoropropane; 0.1735 mol) as a maleimide compound. Thereafter, 1343 g of γ-butyrolactone was introduced into the four neck flask. The contents in the four neck flask were stirred at 60° C. for an hour while introducing nitrogen gas into the four neck flask through the nitrogen gas feed pipe.

Thus, there was obtained a solution of tetracarboxylic acid anhydride oligomer (hereinafter referred to as oligomer solution).

(ii). Preparation of diamine component solution 358.83 g of ABL (1.12 mol) and 8.11 g of TMDS (1,3-bis(3-aminopropyl)tetramethyldisiloxane; 0.0346 mol) were introduced into a four neck flask provided with a temperature gage, a stirring instrument, a reflux condenser, and a nitrogen gas feed pipe. Thereafter, 640 g of γ-butyrolactone was introduced into the four neck flask. The contents in the four neck flask were stirred at room temperature for an hour while introducing nitrogen gas into the four neck flask through the nitrogen gas feed pipe.

Thus, there was obtained a diamine component solution.

(iii). Preparation of polyamide acid composition solution

There was provided a constant flow feeding pump capable of feeding a prescribed amount of a liquid for a given period of time at a given flow rate. Using the constant flow feeding pump, the oligomer solution obtained in the above (i) was injected into a polyethylene bottle at a flow rate of 20 ml/minute over 3.40 minutes, followed by injecting the diamine component solution obtained in the above (ii) into the polyethylene bottle at a flow rate of 10 ml/minute over 3.13 minutes, wherein the oligomer solution and the diamine component solution were made to be in an equimolar amount. Thereafter, the polyethylene bottle was tightly sealed. At this stage, there was found a phase separation between the two solutions in the polyethylene bottle. And thus, it was recognized that a substantial increase in viscosity (namely, polymerization) did not proceed.

Then, the polyethylene bottle containing the two solutions was set to a rotation and revolution centrifugal mixer (trademark name: SNB-350, produced by IKS Kabushiki Kaisha), wherein the two solutions in the polyethylene bottle were well mixed to cause polymerization. Thus, there was obtained a transparent and viscous polyamide acid composition solution. The solid content of the resultant polyamide acid composition solution was found to be 36.5 wt. %.

(iv). The manner in the above (iii) was repeated, to thereby obtain 20 polyamide acid solution samples having a solid content of 36.5 wt. %. As for each of these samples, (a) the amount of the oligomer solution to have been injected and (b) the amount of the diamine component solution to have been injected were examined. Based on the examined results, there were obtained a mean value as for the amounts (a) and a mean value as for the amounts (b). As a result, the former mean value was found to be 82.355 g (43.854 mmol), and the latter mean value was found to be 38.180 g (43.783 mmol). And as for each of the samples, the mole ratio of the tetracarboxylic acid component to the diamine component was examined. As a result, their mole ratio was found to be 1.001±0.003. Further, as for each of the twenty samples, its apparent viscosity after having allowed to stand for 24 hours was examined. As a result, their apparent viscosity was found to be 62500±2500 dyn.s/cm². In addition each of the samples was found to be a homogeneous solution without accompaniment of air bubble.

2. Preparation of polyimide precursor composition

The polyamide acid solution obtained in the above 1-(iii) was subjected to heat treatment at 80° C. for 8 hours in an oven, wherein there was obtained a milky yellow, opaque polyimide precursor composition paste.

As for the resultant polyimide precursor composition paste, there were measured (a) an apparent viscosity at a steady rate of shear of 0.5 sec$^{-1}$ and (b) an apparent viscosity at a steady rate of shear of 20 sec$^{-1}$ in the same manner as in Experiment 1. As a result, the apparent viscosities (a) and (b) were found to be 12000±2000 dyn.s/cm² and 2500±400 dyn.s/cm² respectively. Based on the two apparent viscosities (a) and (b), the polyimide precursor composition paste was found to be of a thixotropic factor of 4.8.

Evaluation

1. Evaluation of printability in the screen printing:

As a patterning plate, there was provided a 250 μm thick stainless steel plate having 5 strip patterns of 5.0 mm×50.0 mm in size spacedly punched at an equal interval of 5 mm in parallel to the direction of movement of the squeegee. The polyimide precursor composition paste was continuously printed through the patterning plate on each of 25 glass substrates by means of the screen printing technique, whereby a plurality of relief patterns were formed on each glass substrate. The resultants were examined. As a result, some of them were found to have a slight protrusion at their pattern edge portions, but all of them were found to be free of print faults such as unevenness, missing portion, line trail, and stain.

Each of the 25 glass substrates each having the relief patterns formed thereon was placed in an oven, wherein it was maintained at 70° C. for an hour, then allowed to stand for 2 hours while gradually raising the environmental temperature from 70° C. to 350° C., and thereafter, it was subjected to thermal curing at 350° C. for 2 hours, whereby a plurality of hardened relief patterns were formed on each glass substrate. The relief patterns thus formed on each glass substrate were found to be of a thickness of 80 to 85 μm.

Examination was made of the relief patterns formed on each glass substrate with respect to pattern size difference between the relief patterns and the patterns of the patterning plate. As a result, the pattern size difference was found to be within a range of ±50 μm in length and breadth for all the 25 glass substrates. Further, examination was made of the relief patterns on each glass substrate with respect to surface size difference between their surfaces and the corresponding surface portions of the glass substrate. As a result, the surface size difference was found to be less than 500 μm in length and breadth for all the 25 glass substrates.

Thus, the relief patterns formed on each of the 25 glass substrates were found to be satisfactory in form retention.

Further, film forming ability was examined by evaluating the relief patterns formed on each glass substrate with respect to their appearance, strength, and form retention. The evaluation was conducted based on the following criteria:

○: the case where the relief patterns on the substrate are free of craze or crack, excellent in appearance, satisfactory in both strength and form retention; and X: the case where the relief patterns on the substrate are accompanied by certain crazes or cracks, not satisfactory in appearance, not satisfactory in either strength or form retention.

Among the 25 samples, one for which the evaluation result was the worst is shown in Table 1.

In Table 1, other results obtained are also shown together with the related conditions employed.

2. Evaluation of film formation (1). There were provided three different substrates, i.e., an aluminum substrate, a silicon wafer substrate, and a silicon wafer substrate applied with a polyimide composition film to its surface. As for each of these three substrates, the polyimide precursor composition paste obtained in the above was applied on its surface in an amount to provide a thickness of about 5 μm when baked, by way of the doctor blade coating manner. The resultant was baked at 350° C. for an hour. In this way, there were obtained three substrate samples each having an about 5 μm thick polyimide composition film formed thereon.

At the polyimide composition film of each substrate sample, 100 squares of 1 mm×1 mm in size were formed in accordance with JIS K-5400, wherein the pressure cooker test was conducted for 100 hours under conditions of 121° C. for the environmental temperature and 2.2 kg/cm² for the pressure applied. As for each substrate sample having been subjected to the pressure cooker test, the tape peel test was conducted in order to evaluate the adhesion of the polyimide composition film of the substrate sample. As a result, no peeling occurred at the polyimide composition film of each substrate sample. Thus, it was found that the polyimide composition film formed on the surface of each substrate excels in adhesion with the substrate.

(2). There were provided three silicon wafer substrates of 6 in. in diameter. As for each of these three silicon wafer substrates, the polyimide precursor composition paste obtained in the above was applied on its surface to form a coating film with a width of 2 cm by the doctor blade coating manner, wherein the amount of the polyimide precursor composition paste applied was made to be in an amount to provide a thickness of about 80 μm when baked. Each of the three resultants was subjected to heat treatment (baking treatment) at 300° C. for an hour, followed by subjecting to thermal curing at 350° C. for an hour. Thus, there were obtained three substrate samples each having an about 80 μm thick polyimide composition film formed thereon. As for each of the three substrate samples, the magnitude of substrate strain and that of residual stress were measured by means of a thin film stress measuring instrument Model F-2300 (produced by Flexus Company). The three substrate samples were found to be −63 μm with respect to the magnitude of substrate strain. And the three substrate samples were found to be 5.5 Mpa with respect to the magnitude of residual stress.

(3). There was provided a glass plate. On the surface of the glass plate, the polyimide precursor composition paste obtained in the above was applied in an amount to provide a thickness of about 10 μm when baked. The resultant was subjected to baking treatment at 350° C. for an hour. Thus, there was formed an about 10 μm thick translucent polyimide composition film on the glass substrate (this polyimide composition film will be hereinafter referred to as polyimide composition film A). The polyimide composition film A was examined with respect to its transmittance for light of 600 nm. As a result, the transmittance of the polyimide composition film A was found to be 62%.

For comparison purpose, the polyamide acid composition solution obtained in Experiment 1 was applied on a glass plate in an amount to provide a thickness of about 10 μm when baked. The resultant was subjected to baking treatment at 350° C. for an hour. Thus, there was formed an about 10 μm thick transparent polyimide composition film on the glass substrate (this polyimide composition film will be hereinafter referred to as polyimide composition film B). The polyimide composition film B was examined with respect to its transmittance for light of 600 nm. As a result, the transmittance of the polyimide composition film B was found to be 82%.

Based on the results obtained, there was obtained a finding that although the polyimide composition films A and B are substantially the same in terms of chemical composition, they are different from each other in terms of physical structure.

EXAMPLE 2

The procedures in the preparation of polyamide acid solution 1 in Example 1 were repeated, except that the maleimide compound comprising OFM was replaced by 2,2'-bis(4-(4-maleimidephenoxy)phenyl)hexafluoropropane and the amount of the solvent comprising γ-butyrolactone was reduced so as to provide a solid content of 34 wt. % for a polyamide acid solution obtained, to thereby obtain a polyamide acid solution with 34 wt. % in solid content.

The polyamide acid solution obtained was subjected to heat treatment at 85° C. for 7 hours, to thereby obtain a polyimide precursor composition paste.

As for the resultant polyimide precursor composition paste, there were measured (a) an apparent viscosity at a steady rate of shear of 0.5 sec$^{-1}$ and (b) an apparent viscosity at a steady rate of shear of 20 sec$^{-1}$ in the same manner as in Experiment 1. As a result, the apparent viscosities (a) and (b) were found to be 12500 dyn.s/cm$^2$ and 2100 dyn.s/cm$^2$ respectively. Based on the two apparent viscosities (a) and (b), the polyimide precursor composition paste was found to be of a thixotropic factor of 6.

A predetermined stress was repeatedly applied to the polyimide precursor composition paste, wherein there were measured (a) an apparent viscosity at a steady rate of shear of 0.5 sec$^{-1}$ and (b) an apparent viscosity at a steady rate of shear of 20 sec$^{-1}$ in the same manner as in Experiment 1. As a result, the apparent viscosities (a) and (b) were found to converge into respective constant values. Particularly, the apparent viscosities (a) and (b) were 6000 dyn.s/cm$^2$ and 1250 dyn.s/cm$^2$ respectively. Based on the two apparent viscosities (a) and (b), the polyimide precursor composition paste was found to be of a thixotropic factor of 4.8.

Evaluation

As for the polyimide precursor composition paste obtained, evaluation was made of its printability in screen printing as follows.

As a patterning plate, there was provided a 60 μm thick stainless steel plate having 5 strip patterns of 5.0 mm×50.0 mm in size and with openings of 150 meshes spacedly punched at an equal interval 5 mm in parallel to the direction of movement of the squeegee. The polyimide precursor composition paste was continuously printed through the patterning plate on each of 25 glass substrates by means of the screen printing technique. The resultants thus printed were examined. As a result, they were found to be free of print faults such as unevenness, missing portion, line trail, and stain.

Each of the 25 glass plates each having printed relief patterns thereon was placed in an oven, wherein the glass plate was maintained at 70° C. for an hour, then allowed to stand for 2 hours while gradually raising the environmental temperature from 70° C. to 350° C., and thereafter, it was subjected to baking treatment at 350° C. for 2 hours. The relief patterns on each glass plate thus treated were found to be of a thickness of about 5 μm. The relief patterns on each glass plate were examined with respect to film quality and packing efficiency. As a result, the relief patterns on each glass plate were found to be excellent in film quality and also in packing efficiency, although some of them were found to be accompanied by slight mesh trails.

Examination was made of the relief patterns formed on each glass plate with respect to pattern size difference between the relief patterns and the patterns of the patterning plate. As a result, the pattern size difference was found to be within a range of ±50 μm in length and breadth for all the 25 glass plates. Further, examination was made of the relief patterns on each glass plate with respect to surface size difference between their surfaces and the corresponding surface portions of the glass plate. As a result, the surface size difference was found to be less than 100 μm in length and breadth for all the 25 glass plates.

Thus, the relief patterns formed on each of the 25 glass plates were found to be satisfactory in form retention.

Further, film forming ability was examined in the same manner as in Example 1.

The results obtained are shown in Table 1, together with the related conditions employed.

COMPARATIVE EXAMPLES 1 AND 2

Comparative Example 1

The procedures of Example 1 were repeated, except that in the preparation of polyimide precursor composition 2, the period of time (8 hours) for the heat treatment was changed to 4 hours, to thereby obtain a polyimide precursor composition. As for the resultant polyimide precursor composition, there were measured (a) an apparent viscosity at a steady rate of shear of 0.5 sec$^{-1}$ and (b) an apparent viscosity at a steady rate of shear of 20 sec$^{-1}$ in the same manner as in Experiment 1. As a result, the apparent viscosities (a) and (b) were found to be 10000 dyn.s/cm$^2$ and 5000 dyn.s/cm$^2$ respectively. Based on the two apparent viscosities (a) and (b), the polyimide precursor composition paste was found to be of a thixotropic factor of 2.

As for the polyimide precursor composition paste, evaluation was made with respect to its printability in the screen printing in the same manner as in Example 2. As a result, the relief patterns formed were found to be accompanied by remarkable line trails. In this respect, it is understood that the polyimide precursor composition paste is inferior in printability in screen printing.

Further, film forming ability was examined in the same manner as in Example 1.

The results obtained are shown in Table 1, together with the related conditions employed.

Comparative Example 2

The procedures of Example 1 were repeated, except that in the preparation of polyimide precursor composition 2, the period of time (8 hours) for the heat treatment was changed to 10 hours, to thereby obtain a polyimide precursor composition paste. As for the resultant polyimide precursor composition paste, there were measured (a) an apparent viscosity at a steady rate of shear of 0.5 sec$^{-1}$ and (b) an apparent viscosity at a steady rate of shear of 20 sec$^{-1}$ in the same manner as in Experiment 1. As a result, the apparent viscosities (a) and (b) were found to be 4000 dyn.s/cm$^2$ and 1700 dyn.s/cm$^2$ respectively. Based on the two apparent viscosities (a) and (b), the polyimide precursor composition paste was found to be of a thixotropic factor of 2.4.

As for the polyimide precursor composition paste, evaluation was made with respect to its printability in screen printing in the same manner as in Example 2. As a result, the relief patterns formed were found to have suffered from occurrence of crazes or cracks upon the baking treatment. In this respect, it is understood that the polyimide precursor composition paste is inferior in film forming ability.

Further, film forming ability was examined in the same manner as in Example 1.

The results obtained are shown in Table 1, together with the related conditions employed.

EXAMPLE 3

The procedures in the preparation of polyamide acid solution 1 in Example 1 were repeated, except that the maleimide compound comprising OFM was not used and the amount of the solvent comprising γ-butyrolactone was reduced so as to provide a solid content of 36.5 wt. % for a polyamide acid solution obtained, to thereby obtain a polyamide acid solution with 36.5 wt. % solid content.

The polyamide acid solution obtained was subjected to heat treatment at 85° C. for 5 hours, to thereby obtain a polyimide precursor composition paste.

As for the resultant polyimide precursor composition paste, there were measured (a) an apparent viscosity at a steady rate of shear of 0.5 sec$^{-1}$ and (b) an apparent viscosity at a steady rate of shear of 20 sec$^{-1}$ in the same manner as in Experiment 1. As a result, the apparent viscosities (a) and (b) were found to be 3500 dyn.s/cm$^2$ and 1000 dyn.s/cm$^2$ respectively. Based on the two apparent viscosities (a) and (b), the polyimide precursor composition paste was found to be of a thixotropic factor of 3.5.

Evaluation

As for the polyimide precursor composition paste obtained, evaluation was made of its printability in screen printing as follows.

As a patterning plate, there was provided a 60 μm thick stainless steel plate having 5 strip patterns of 5.0 mm×50.0 mm in size and with openings of 150 meshes spacedly punched at an equal interval 5 mm in parallel to the direction of movement of the squeegee. The polyimide precursor composition paste was continuously printed through the patterning plate on each of 25 glass substrates by means of the screen printing technique. The resultants thus printed were examined. As a result, they were found to be free of print faults such as unevenness, missing portion, line trail, and stain.

Each of the 25 glass substrates each having printed relief patterns thereon was placed in an oven, wherein the glass plate was maintained at 70° C. for an hour, then allowed to stand for 2 hours while gradually raising the environmental temperature from 70° C. to 350° C., and thereafter, it was subjected to baking treatment at 350° C. for 2 hours. The relief patterns on each glass plate thus treated were found to be of a thickness of about 5 μm. The relief patterns on each glass plate were examined with respect to film quality and packing efficiency. As a result, the relief patterns on each glass plate were found to be excellent in film quality and also in packing efficiency.

Examination was made of the relief patterns formed on each glass plate with respect to pattern size difference between the relief patterns and the patterns of the patterning plate. As a result, the pattern size difference was found to be within a range of ±50 μm in length and breadth as for all the 25 glass plates. Further, examination was made of the relief patterns on each glass plate with respect to surface size difference between their surfaces and the corresponding surface portions of the glass plate. As a result, the surface size difference was found to be less than 100 μm in length and breadth for all the 25 glass plates.

Thus, the relief patterns formed on each of the 25 glass plates were found to be satisfactory in form retention.

Further, film forming ability was examined in the same manner as in Example 1.

The results obtained are shown in Table 1, together with the related conditions employed.

Comparative Example 3

The procedures for the preparation of the polyamide acid composition solution 1 in Experiment 1 were repeated to thereby obtain a polyamide acid composition solution of 490 dyn.s/cm$^2$ in apparent viscosity and 15 wt. % in solid content. The resultant polyamide acid composition solution was subjected to heat treatment at 80° C. for 10 hours, wherein the polyamide acid composition solution was not opaqued. The polyamide acid composition solution thus treated was measured with respect to its apparent viscosity. As a result, it was found to be 0.5 dyn.s/cm$^2$ in apparent viscosity. Then, the resultant was subjected to continuous heat treatment over a long period of time, wherein it was never opaqued. In this case, since no precipitation occurred, the evaluation of film forming ability was not conducted. The results obtained are shown in Table 1, together with the related conditions employed.

Comparative 4

The procedures for the preparation of the polyamide acid composition solution 1 in Experiment 1 were repeated, except that the amount of the solvent comprising γ-butyrolactone was reduced so as to provide a solid content of 20 wt. % for a final product, to thereby obtain a polyamide acid composition solution of 2300 dyn.s/cm$^2$ in apparent viscosity and 20 wt. % in solid content. The resultant polyamide acid composition solution was subjected to heat treatment at 80° C. for 10 hours, wherein the polyamide acid composition solution was slightly opaqued. The polyamide acid composition solution thus treated was measured with respect to its apparent viscosity. As a result, it was found to be 1 dyn.s/cm$^2$ in apparent viscosity. Then, the resultant was subjected to continuous heat treatment, wherein after having been subjected to heat treatment for 23 hours, it became a white homogeneous paste containing fine particles dispersed therein. When the resultant paste was stirred, there was afforded a suspension of 0.5 dyn.s/cm$^2$ in apparent viscosity. Further, film forming ability was examined in the same manner as in Example 1.

The results obtained are shown in Table 1, together with the related conditions employed.

Comparative Example 5

The procedures in the preparation of polyamide acid composition solution 1 in Experiment 1 were repeated, except that no OFM was used, the solvent comprising γ-butyrolactone was replaced by N-methylpyrrolidone, and the amount of said N-methylpyrrolidone was adjusted so as to provide a solid content of 35 wt. % for a final product, to thereby obtain a polyamide acid composition solution of 80000 dyn.s/cm$^2$ in apparent viscosity and 35 wt. % in solid content. The resultant polyamide acid composition solution was subjected to heat treatment at 90° C. for 56 hours, wherein no change occurred in its transparency. As for the polyamide acid composition solution thus treated, its apparent viscosity was measured in the same manner as in Experiment 1. As a result, its apparent viscosity was found to be 0.5 dyn.s/cm$^2$ Thus, the evaluation of film forming ability was not conducted.

The results obtained are shown in Table 1, together with the related conditions employed.

EXAMPLES 4 TO 10

Example 4

The procedures for the preparation of polyamide acid solution 1 in Example 1 were repeated, except that the tetracarboxylic acid anhydride comprising PMDA was replaced by BTDA (that is, benzophenonetetracarboxylic acid dianhydride), the maleimide compound (OFM) was not used, and the amount of the solvent comprising γ-butyrolactone was adjusted to provide a solid content of 35 wt. % for a final product, to thereby obtain a polyamide acid solution with 35 wt. % in solid content.

The polyamide acid solution obtained was subjected to heat treatment at 80° C. for 5 hours, to thereby obtain a polyimide precursor composition paste. As for the resultant polyimide precursor composition paste, its thixotropic factor was observed in the same manner as in Example 1. As a result, the polyimide precursor composition paste was found to be 5 in thixotropic factor. The results obtained are shown in Table 1, together with the related conditions employed.

Example 5

The procedures for the preparation of polyamide acid solution 1 in Example 1 were repeated, except that the tetracarboxylic acid anhydride comprising PMDA was replaced by BPDA (that is, biphenyltetracarboxylic acid dianhydride), the maleimide compound (OFM) was not used, and the amount of the solvent comprising γ-butyrolactone was adjusted to provide a solid content of 35 wt. % for a final product, to thereby obtain a polyamide acid solution with 35 wt. % in solid content.

The polyamide acid solution obtained was subjected to heat treatment at 80° C. for 6 hours, to thereby obtain a polyimide precursor composition paste. As for the resultant polyimide precursor composition paste, its thixotropic factor was observed in the same manner as in Example 1. As a result, the polyimide precursor composition paste was found to be 4 in thixotropic factor. The results obtained are shown in Table 1, together with the related conditions employed.

Example 6

The procedures for the preparation of polyamide acid solution 1 in Example 1 were repeated, except that the tetracarboxylic acid anhydride comprising PMDA was replaced by a mixture of PMDA and BTDA (that is, benzophenonetetracarboxylic acid dianhydride) with a mixing ratio of 70:30, and the amount of the solvent comprising γ-butyrolactone was adjusted to provide a solid content of 37.5 wt. % for a final product, to thereby obtain a polyamide acid solution with 37.5 wt. % in solid content.

The polyamide acid solution obtained was subjected to heat treatment at 90° C. for 4 hours, to thereby obtain a polyimide precursor composition paste. As for the resultant polyimide precursor composition paste, its thixotropic factor was observed in the same manner as in Example 1. As a result, the polyimide precursor composition paste was found to be 4 in thixotropic factor. The results obtained are shown in Table 1, together with the related conditions employed.

Example 7

The procedures for the preparation of polyamide acid solution 1 in Example 1 were repeated, except that the tetracarboxylic acid anhydride comprising PMDA was replaced by a mixture of PMDA and 6FDA (that is, hexafluoroisopropylidenephthalic acid dianhydride) with a mixing ratio of 85:15, and the amount of the solvent comprising γ-butyrolactone was adjusted to provide a solid content of 36.5 wt. % for a final product, to thereby obtain a polyamide acid solution with 36.5 wt. % in solid content.

The polyamide acid solution obtained was subjected to heat treatment at 90° C. for 3 hours, to thereby obtain a polyimide precursor composition paste. As for the resultant polyimide precursor composition paste, its thixotropic factor was observed in the same manner as in Example 1. As a result, the polyimide precursor composition paste was found to be 4 in thixotropic factor. The results obtained are shown in Table 1, together with the related conditions employed.

Example 8

The procedures for the preparation of polyamide acid solution 1 in Example 1 were repeated, except that the tetracarboxylic acid anhydride comprising PMDA was replaced by a mixture of PMDA and ODPA (that is, oxydiphthalic acid dianhydride) with a mixing ratio of 95:5, and the amount of the solvent comprising γ-butyrolactone was adjusted to provide a solid content of 37.5 wt. % for a final product, to thereby obtain a polyamide acid solution with 37.5 wt. % in solid content.

The polyamide acid solution obtained was subjected to heat treatment at 80° C. for 10 hours, to thereby obtain a polyimide precursor composition paste. As for the resultant polyimide precursor composition paste, its thixotropic factor was observed in the same manner as in Example 1. As a result, the polyimide precursor composition paste was found to be 4.5 in thixotropic factor. The results obtained are shown in Table 1, together with the related conditions employed.

Example 9

The procedures for the preparation of polyamide acid solution 1 in Example 1 were repeated, except that the diamine component comprising ABL was replaced by a mixture of ABL and AFA (that is, 2,2-bis(4-(4-aminophenoxy)phenyl)hexafluoropropane) with a mixing ratio of 70:30, and the amount of the solvent comprising γ-butyrolactone was adjusted to provide a solid content of 36 wt. % for a final product, to thereby obtain a polyamide acid solution with 36 wt. % in solid content.

The polyamide acid solution obtained was subjected to heat treatment at 85° C. for 6 hours, to thereby obtain a polyimide precursor composition paste. As for the resultant polyimide precursor composition paste, its thixotropic factor was observed in the same manner as in Example 1. As a result, the polyimide precursor composition paste was found to be 3.5 in thixotropic factor. The results obtained are shown in Table 1, together with the related conditions employed.

Example 10

The procedures for the preparation of polyamide acid solution 1 in Example 1 were repeated, except that the diamine component comprising ABL was replaced by a mixture of ABL and BAPS (that is, bis(4-(3-aminophenoxy)phenyl)sulfone) with a mixing ratio of 80:20, and the amount of the solvent comprising γ-butyrolactone was adjusted to provide a solid content of 34 wt. % for a final product, to thereby obtain a polyamide acid solution with 34 wt. % in solid content.

The polyamide acid solution obtained was subjected to heat treatment at 85° C. for 6 hours, to thereby obtain a polyimide precursor composition paste. As for the resultant polyimide precursor composition paste, its thixotropic factor was observed in the same manner as in Example 1. As a result, the polyimide precursor composition paste was found to be 4 in thixotropic factor. The result obtained are shown in Table 1, together with the related conditions employed.

Evaluation

As for each of the polyimide precursor composition pastes obtained in Examples 4 to 10, evaluation was made of its printability in screen printing in the following manner.

As a patterning plate, there was provided a 60 μm thick stainless steel plate having 5 strip patterns of 5.0 mm×50.0 mm in size and with openings of 150 meshes spacedly punched at an equal interval 5 mm in parallel to the direction of movement of the squeegee. The polyimide precursor composition paste was continuously printed through the patterning plate on each of 25 glass substrates by means of the screen printing technique. The resultants thus printed were examined. As a result, they were found to be free of print faults such as unevenness, missing portion, line trail, and stain.

Each of the 25 glass plates each having printed relief patterns thereon was placed in an oven, wherein the glass plate was maintained at 70° C. for an hour, then allowed to stand for 2 hours while gradually raising the environmental temperature from 70° C. to 350° C., and thereafter, it was subjected to baking treatment at 350° C. for 2 hours. The relief patterns on each glass plate thus treated were found to be of a thickness of about 5 μm. The relief patterns on each glass plate were examined with respect to film quality and packing efficiency. As a result, the relief patterns on each glass plate were found to be excellent in film quality and also in packing efficiency, although some of them were found to be accompanied by a slight mesh trail.

Examination was made of the relief patterns formed on each glass plate with respect to pattern size difference between the relief patterns and the patterns of the patterning plate. As a result, the pattern size difference was found to be within a range of ±50 μm in length and breadth for all the 25 glass plates. Further, examination was made of the relief patterns on each glass plate with respect to surface size difference between their surfaces and the corresponding surface portions of the glass plate. As a result, the surface size difference was found to be less than 100 μm in length and breadth for all the 25 glass plates.

Thus, the relief patterns formed on each of the 25 glass plates were found to be satisfactory in form retention.

Further, in each case, film forming ability was evaluated in the same manner as in Example 1. The results obtained are collectively shown in Table 1.

COMPARATIVE EXAMPLES 6 TO 9

Comparative Example 6

The procedures for the preparation of polyamide acid solution 1 in Example 1 were repeated, except that the tetracarboxylic acid anhydride comprising PMDA was replaced by BTDA (that is, benzophenonetetracarboxylic acid dianhydride), the maleimide compound (OFM) was not used, and the amount of the solvent comprising γ-butyrolactone was adjusted to provide a solid content of 20 wt. % for a final product, to thereby obtain a polyamide acid solution with 20 wt. % in solid content.

The polyamide acid solution obtained was subjected to heat treatment at 90° C. for 48 hours, to thereby obtain a polyimide precursor composition paste. As for the resultant polyimide precursor composition paste, its thixotropic factor was observed in the same manner as in Example 1. As a result, the polyimide precursor composition paste was found to be 2.5 in thixotropic factor. The results obtained are shown in Table 1, together with the related conditions employed.

Comparative Example 7

The procedures for the preparation of polyamide acid solution 1 in Example 1 were repeated, except that the tetracarboxylic acid anhydride comprising PMDA was replaced by BPDA, the maleimide compound (OFM) was not used, and the amount of the solvent comprising γ-butyrolactone was adjusted to provide a solid content of 20 wt. % for a final product, to thereby obtain a polyamide acid solution with 20 wt. % in solid content.

The polyamide acid solution obtained was subjected to heat treatment at 90° C. for 48 hours. As a result, there was obtained a non-homogeneous composition with a phase separation comprising a precipitate phase and a liquid phase. The results obtained are shown in Table 1, together with the related conditions employed.

Comparative Example 8

The procedures for the preparation of polyamide acid solution 1 in Example 1 were repeated, except that the diamine component comprising ABL was replaced by a mixture of ABL and DDS (that is, 3,3'-diaminodiphenylsulfone) with a mixing ratio of 50:50, and the amount of the solvent comprising γ-butyrolactone was adjusted to provide a solid content of 34 wt. % for a final product, to thereby obtain a polyamide acid solution with 34 wt. % in solid content.

The polyamide acid solution obtained was subjected to heat treatment at 85° C. for 8 hours, to thereby obtain a polyimide precursor composition paste. As for the resultant polyimide precursor composition paste, its thixotropic factor was observed in the same manner as in Example 1. As a result, the polyimide precursor composition paste was found to be 2.5 in thixotropic factor. The results obtained are shown in Table 1, together with the related conditions employed.

Comparative Example 9

The procedures for the preparation of polyamide acid solution 1 in Example 1 were repeated, except that the diamine component comprising ABL was replaced by ODA (that is, 4,4'-oxydianiline), and the amount of the solvent comprising γ-butyrolactone was adjusted to provide a solid content of 15 wt. % for a final product, to thereby obtain a polyamide acid solution with 15 wt. % in solid content.

The polyamide acid solution obtained was subjected to heat treatment at 90° C. for 15 hours, to thereby obtain a non-homogenous polyimide precursor composition with a phase separation comprising a precipitate phase and a liquid phase. The results obtained are shown in Table 1, together with the related conditions employed.

Evaluation

As for each of the polyimide precursor compositions obtained in Comparative Examples 6 to 9, evaluation was conducted with respect to its film forming ability in the same manner as in Example 1 wherein film forming ability is evaluated by forming relief patterns on a plurality of glass plates by way of screen printing. As for the polyimide precursor compositions obtained in Comparative Examples 7 and 9, no reasonable relief pattern could be formed because they were non-homogeneous polyimide compositions with a phase separation comprising a precipitate phase and a liquid phase. Thus, each of the polyimide precursor compositions obtained in Comparative Examples 7 and 9 was found to be extremely poor in film forming ability. As for each of the polyimide precursor compositions obtained in Comparative Examples 6 and 8, there could be formed reasonable relief patterns but those relief patterns were found to be accompanied by distinguishable cracks. Thus, each of the polyimide precursor compositions obtained in Comparative Examples 6 and 8 was found to be inferior in film forming ability.

The evaluated results obtained are collectively shown in Table 1.

As apparent from the results obtained in the foregoing examples of the present invention, the following facts are understood. That is, the polyimide precursor compositions according to the present invention exhibit a desirable apparent viscosity and a desirable thixotropic property and they excel in film forming ability, and because of this, they enable one to form a high quality relief pattern film with no defect and which excels in form retention by way of the screen printing. The polyimide precursor compositions according to the present invention can be effectively produced by a simple manner.

Further, the polyimide precursor compositions according to the present invention are extremely suitable for use in the electronics, electric, optical, or precision industry, wherein it is required to form a high quality relief pattern film, which is required to have a reduced dielectric constant and a reduced residual stress and to have a sufficient heat resistance, moisture resistance, physical strength, and chemical stability, by way of screen printing.

TABLE 1

| | diamine component | tetracarboxylic acid component | maleimide compound | solid content wt % | heat treatment °C./hr. | precipitation | thixotropic factor | film forming ability |
|---|---|---|---|---|---|---|---|---|
| Example | | | | | | | | |
| 1 | ABL | PMDA | OFM | 36.5 | 80/8 | observed | 4.8 | O |
| 2 | ABL | PMDA | AFM | 34 | 85/7 | observed | 6 | O |
| 3 | ABL | PMDA | not used | 36.5 | 80/5 | observed | 3.5 | O |
| 4 | ABL | BTDA | not used | 35 | 80/5 | observed | 5 | O |
| 5 | ABL | BPDA | not used | 35 | 80/6 | observed | 4 | O |
| 6 | ABL | BTDA/PMDA 30/70 | OFM | 37.5 | 90/4 | observed | 4 | O |
| 7 | ABL | 6FDA/PMDA 15/85 | OFM | 36.5 | 90/3 | observed | 4 | O |
| 8 | ABL | ODPA/PMDA 5/95 | OFM | 37.5 | 80/10 | observed | 4.5 | O |
| 9 | ABL/AFA 70/30 | PMDA | OFM | 36 | 85/6 | observed | 3.5 | O |
| 10 | ABL/BAPS 80/20 | PMDA | OFM | 34 | 85/6 | observed | 4 | O |
| Comparative Example | | | | | | | | |
| 1 | ABL | PMDA | OFM | 36.5 | 80/4 | observed | 2 | x |
| 2 | ABL | PMDA | OFM | 36.5 | 80/10 | observed | 2.4 | x |
| 3 | ABL | PMDA | OFM | 15 | 80/10 | none | — | — |
| 4 | ABL | PMDA | OFM | 20 | 80/23 | observed | — | x |
| 5 | ABL | PMDA | not used | 35(NMP) | 90/56 | none | — | — |
| 6 | ABL | BTDA | not used | 20 | 90/48 | observed | 2.5 | x |

TABLE 1-continued

|   | diamine component | tetracarboxylic acid component | maleimide compound | solid content wt % | heat treatment °C./hr. | precipitation | thixotropic factor | film forming ability |
|---|---|---|---|---|---|---|---|---|
| 7 | ABL | BPDA | not used | 20 | 90/48 | observed | phase separation | × |
| 8 | ABL/DDS 50/50 | PMDA | OFM | 34 | 85/8 | observed | 2.5 | × |
| 9 | ODA | PMDA | OFM | 15 | 90/15 | observed | phase separation | × |

What is claimed is:

1. A screen printing ink which comprises a polyimide precursor composition having a thixotropic property and which is produced by (i) providing a polyamide acid solution obtained by reacting an aromatic tetracarboxylic acid component, a diamine component and a maleimide compound in the presence of an oxygen-containing solvent and (ii) subjecting said polyamide acid solution to heat treatment.

2. A screen printing ink according to claim 1, wherein the maleimide compound is a fluorine-containing bismaleimide compound and said fluorine-containing bismaleimide compound is used in an amount corresponding to 5 to 30 wt. % versus the total amount of the aromatic tetracarboxylic acid component and the diamine component.

3. A screen printing ink according to claim 1, wherein the aromatic tetracarboxylic acid component comprises a compound (a) selected from the group consisting of benzenetetracarboxylic acid dianhydride (a-i), biphenyltetracarboxylic acid dianhydride (a-ii), terphenyltetracarboxylic acid dianhydride (a-iii), benzophenonetetracarboxylic acid dianhydride (a-iv) and reactive esters derived from said dianhydrides (a-i) to (a-iv), and a compound (b) selected from the group consisting of tetracarboxylic acid dianhydrides (b-i) other than said dianhydrides (a-i) to (a-iv) and reactive esters derived from said dianhydrides (b-i); the diamine component comprises a compound (c) selected from the group consisting of 2,2'-bis (trifluoromethyl)diaminodiphenyl compound (c-i) and reactive esters derived from said compound (c-i), and a compound (d) selected from siloxydiamine compounds; the maleimide compound comprises a compound (e) selected from the group consisting of fluorine-containing bismaleimide compounds; and the oxygen-containing solvent has a boiling point of 180° C. to 300° C.

4. A screen printing ink according to claim 1 which is used for obtaining a polyimide composition material by applying said screen printing ink on a substrate by means of screen printing, and subjecting said screen printing ink disposed on said substrate to baking treatment.

5. A screen printing ink according to claim 1 which is used in a screen printing method.

6. A process for producing a screen printing ink comprising a polyimide precursor composition having a thixotropic property, said process comprising the steps of:

reacting an aromatic tetracarboxylic acid component, a diamine component and a maleimide compound in the presence of an oxygen-containing solvent to obtain a polyamide acid solution, and subjecting said polyamide acid solution to heat treatment.

7. A process according to claim 6, wherein the heat treatment is conducted at a temperature of 60° C. to 100° C.

8. A process according to claim 6, wherein the aromatic tetracarboxylic acid component comprises a compound (a) selected from the group consisting of benzenetetracarboxylic acid dianhydride (a-i), biphenyltetracarboxylic acid dianhydride (a-ii), terphenyltetracarboxylic acid dianhydride (a-iii), benzophenonetetracarboxylic acid dianhydride (a-iv) and reactive esters derived from said dianhydrides (a-i) to (a-iv), and a compound (b) selected from the group consisting of tetracarboxylic acid dianhydrides (b-i) other than said dianhydrides (a-i) to (a-iv) and reactive esters derived from said dianhydrides (b-i); the diamine component comprises a compound (c) selected from the group consisting of 2,2'-bis (trifluoromethyl)diaminodiphenyl compound (c-i) and reactive esters derived from said compound (c-i), and a compound (d) selected from siloxydiamine compounds; the maleimide compound comprises a compound (e) selected from the group consisting of fluorine-containing bismaleimide compounds; and the oxygen-containing solvent has a boiling point of 180° C. to 300° C.

* * * * *